(12) United States Patent
Yamada

(10) Patent No.: US 11,873,192 B2
(45) Date of Patent: Jan. 16, 2024

(54) ELEVATOR DOOR CONTROL SYSTEM

(71) Applicant: Mitsubishi Electric Corporation, Tokyo (JP)

(72) Inventor: Kazuhiro Yamada, Aichi (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/912,052

(22) PCT Filed: Mar. 30, 2020

(86) PCT No.: PCT/JP2020/014448
§ 371 (c)(1),
(2) Date: Sep. 16, 2022

(87) PCT Pub. No.: WO2021/199106
PCT Pub. Date: Oct. 7, 2021

(65) Prior Publication Data
US 2023/0183043 A1 Jun. 15, 2023

(51) Int. Cl.
*B66B 13/26* (2006.01)
*G01R 31/58* (2020.01)
*B66B 13/14* (2006.01)

(52) U.S. Cl.
CPC ............ *B66B 13/26* (2013.01); *B66B 13/143* (2013.01); *G01R 31/58* (2020.01)

(58) Field of Classification Search
CPC ..... B66B 13/26; B66B 13/143; B66B 5/0025; B66B 5/02; G01R 31/58
See application file for complete search history.

(56) References Cited

U.S. PATENT DOCUMENTS

| 9,586,790 B2 * | 3/2017 | Tyni | ................... B66B 13/146 |
| 2014/0008152 A1 * | 1/2014 | Annen | ................ B66B 5/0025 187/247 |

(Continued)

FOREIGN PATENT DOCUMENTS

| JP | 4-79950 B2 | 12/1992 |
| KR | 20100004366 A | 1/2010 |

(Continued)

OTHER PUBLICATIONS

Indian Office Action dated Nov. 9, 2022, in corresponding IN Patent Application No. 202247052487, 6 pp.

(Continued)

*Primary Examiner* — Michael A Riegelman
(74) *Attorney, Agent, or Firm* — XSENSUS LLP

(57) ABSTRACT

An elevator door control system comprises a door sensor, a door motor control unit, a transmission unit being wired by a cable as part of or all of a transmission path between the door sensor and the door motor control unit, a storage unit to store a change in a binary signal indicating detection of an obstacle in association with a door position at a time of the change in the binary signal. A partially broken state of the cable is determined by evaluating reproducibility of the door position at the time of the change in the binary signal on the basis of the timing of the change in the binary signal and a door position at the time of the change in the binary signal. The partially broken state of the cable caused by repeated bending deformation of the cable can be determined.

9 Claims, 8 Drawing Sheets

(56) References Cited

U.S. PATENT DOCUMENTS

| | | | | |
|---|---|---|---|---|
| 2018/0086605 A1* | 3/2018 | Saarela | | B66B 13/22 |
| 2019/0010020 A1* | 1/2019 | Koushik | | B66B 5/0037 |
| 2019/0010022 A1* | 1/2019 | Trcka | | G05B 13/0265 |
| 2019/0100412 A1* | 4/2019 | Han | | G06F 18/00 |
| 2019/0193986 A1* | 6/2019 | Studer | | B66B 5/0012 |
| 2020/0131006 A1* | 4/2020 | Rampone | | B66B 13/143 |
| 2020/0207573 A1* | 7/2020 | Schmidt | | B66B 5/02 |
| 2023/0183043 A1* | 6/2023 | Yamada | | B66B 13/143 |
| | | | | 187/314 |

FOREIGN PATENT DOCUMENTS

| | | |
|---|---|---|
| KR | 20140117967 A | 10/2014 |
| KR | 101749291 B1 | 6/2016 |
| WO | 2012/008035 A1 | 1/2012 |

OTHER PUBLICATIONS

International Search Report and Written Opinion dated Jun. 16, 2020, received for PCT Application PCT/JP2020/014448, filed on Mar. 30, 2020, 8 pages including English Translation.

* cited by examiner

ELEVATOR DOOR CONTROL SYSTEM

CROSS-REFERENCE TO RELATED APPLICATION

The present application is based on PCT filing PCT/JP2020/014448, filed Mar. 30, 2020, the entire contents of which are incorporated herein by reference.

TECHNICAL FIELD

The present disclosure relates to an elevator door control system for determining a partially broken state of a wire, which is one of deterioration phenomena of an electric wire in a cable caused by repeated bending deformation of the cable of an obstacle detection door sensor for each opening/closing operation of an elevator door.

BACKGROUND ART

Some conventional elevator door control systems are constituted with a test apparatus for a mechanical pinch detection sensor, the apparatus implementing a quasi-state in which an object is caught between doors with the doors fully closed using a mechanical member. With this configuration, a failure of the mechanical pinch detection sensor is detected (for example, see Patent Document 1).

The mechanical pinch detection sensor is basically provided in the vicinity of the front end part of the car door, which is to be opened and closed. Thus, if there is an obstacle at the entrance of the elevator, the contact with the obstacle can be detected. As a specific configuration for the contact detection, an obstacle detection switch to be activated by the contact with the obstacle is provided. When the obstacle detection switch is activated, a detection signal of the obstacle detection switch is transmitted to the door control device, and the safe operation of the door may be achieved by, for example, performing control to reverse the opening/closing direction of the door, control in which the door speed is sharply reduced, or the like. Therefore, in order to transmit the detection signal of the obstacle detection switch to the door control device, a cable connecting the obstacle detection switch to the door control device is required. Regarding this cable, in another conventional elevator door control system, a configuration has been proposed in which the cable is wired along a link mechanism provided between a lower part of the car door and a lower part of the car in terms of, for example, appearance and noise reduction (see, for example, Patent Document 2).

Note that, in this case, the cable is arranged along the link mechanism, and a plurality of portions thereof are fixed to the link mechanism. Specifically, it is not fixed to the link mechanism in the vicinity of a joint portion (or a joint) of the link mechanism but is fixed to the link mechanism at positions away from the joint portion (or the joint).

CITATION LIST

Patent Document

Patent Document 1: PCT International Publication No. WO2012/008035

Patent Document 2: Japanese Examined Patent Application Publication No. 114-79950 (page 4, FIG. 1)

SUMMARY OF INVENTION

Problems to be Solved by Invention

However, when the wiring method disclosed in Patent Document 2 is employed in the cable for connecting the obstacle detection switch and the door control device, a bending stress is applied to a portion of the cable that is not fixed to the link mechanism near the joint portion of the link mechanism due to an extension motion and a bending motion of the link mechanism accompanied by a door opening/closing operation at the entrance of the elevator. Since the door opening/closing operation is repeatedly performed, the bending stress is repeatedly applied to the portion of the cable near the joint portion. As a result, as the number of times of door opening/closing operations increases in a new cable, the state of the cable changes from an initial conductive state to a partially broken state in which the conduction becomes poor sooner or later. Finally, there may be a disconnected state in which the conduction is not possible.

Note that, here, for example regarding the electric wire (for example, stranded wire) formed of elemental wires inside the cable covered with resin, the partially broken wire means a wire in a state in which some of the elemental wires are broken. When the electric wire in the cable is in the partially broken state, a current flowing in the electric wire is unstable, leading to poor conduction. Therefore, in the case of the detection signal of the obstacle detection switch transmitted by using the cable, when the cable is in the partially broken state, it is difficult to definitely judge a value of a binary signal indicating detection of an obstacle, which is obtained on the basis of the detection signal of the obstacle detection switch during the door opening/closing operation. That is, the value of the binary signal indicating detection of an obstacle behaves stochastically. This is because, when some of the elemental wires constituting the electric wire in the cable are mechanically disconnected, before and after a specific posture of the link mechanism during the door opening/closing operation, an electrically broken state is exhibited accordingly, or an electrical connection state is exhibited even though some of the elemental wires are mechanically disconnected.

Therefore, in the conventional elevator door control system disclosed in Patent Document 1, when the wiring method disclosed in Patent Document 2 is adopted as a wiring method of the cable connecting the obstacle detection switch to the door control device, a partially broken state of the cable, that is, a state in which the current flowing through the electric wire in the cable is unstable and conduction characteristics are poor occurs not definitely but stochastically. As a result, even if the quasi-state in which an object is caught between the doors by the test apparatus of the mechanical pinch detection sensor is implemented and a value of the binary signal indicating detection of an obstacle is obtained, there is a problem in that it is difficult to definitely determine that the electric wire in the cable is in the partially broken state.

The present disclosure is made to overcome such conventional problems and an object of the present disclosure is to provide an elevator door control system capable of easily detecting a partially broken state of electric wire in a cable due to repeated bending deformation of the cable of a door sensor for obstacle detection at each of opening/closing operations of an elevator door.

Means for Solving Problems

An elevator door control system according to the present disclosure includes a door sensor to detect an obstacle against a door opening/closing operation at an entrance of an elevator, a door motor control unit to control the door opening/closing operation based on a detection result of the door sensor, a transmission unit to transmit a signal between the door sensor and the door motor control unit, the transmission unit being wired by a cable as part of or all of a transmission path between the door sensor and the door motor control unit, a storage unit to store a change in a binary signal indicating detection of an obstacle in association with a door position at a time of the change in the binary signal, the change being obtained based on a detection signal of the door sensor during the door opening/closing operation, and a partially broken state determination unit to determine whether or not the cable is in a partially broken state based on a timing of the change in the binary signal and a door position at the time of the change in the binary signal, wherein the cable is arranged along a link mechanism that performs an extension motion and a bending motion accompanied by the door opening/closing operation and is fixed to the link mechanism at a plurality of portions, and the partially broken state determination unit determines whether or not the cable is in the partially broken state based on reproducibility of the door position at the time of the change in the binary signal.

Effect of Invention

According to the configuration of the present disclosure, since the partially broken state determination unit determines whether or not the cable is in the partially broken state on the basis of the reproducibility of the door position at the time of the change in the binary signal indicating the detection of an obstacle, it is possible to easily detect whether or not the cable is in the partially broken state even if a partially broken state in which the current flowing through the electric wire in the cable becomes unstable and the conduction characteristics become poor occurs stochastically.

MODES FOR CARRYING OUT INVENTION

Figure 1:
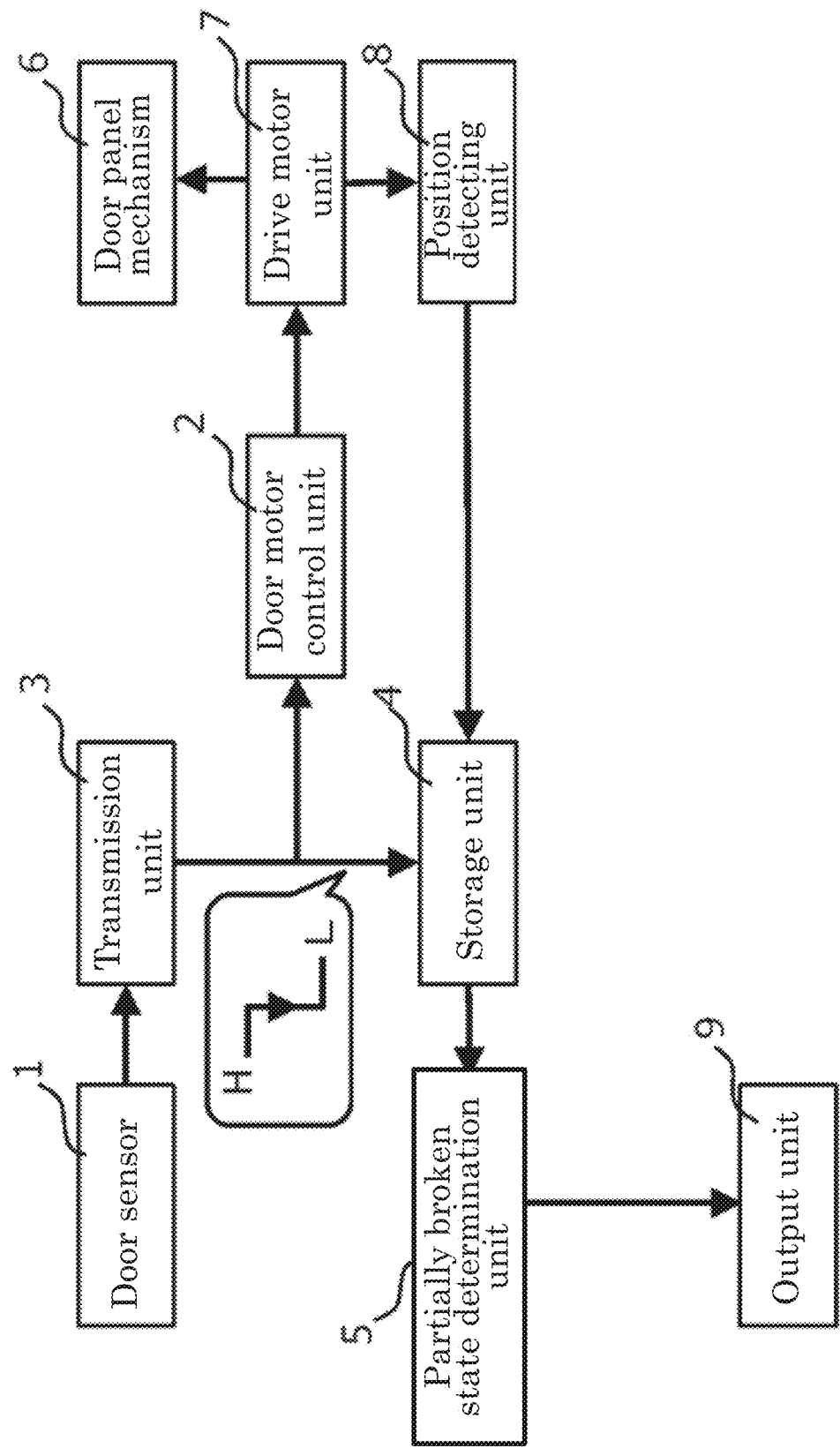
FIG. 1 is a diagram for explaining a configuration of an elevator door control system according to Embodiment 1.

Hereinafter, the elevator door control system according to the present disclosure will be described according to each of embodiments, with reference to the accompanying drawings as necessary. Note that, in each of the embodiments and each of drawings, the same or corresponding parts are denoted by the same reference numerals, and a repetitive description is appropriately simplified or omitted. In addition, in each of the embodiments and each of the drawings, corresponding parts will be appropriately described by using the same reference numerals as long as no misunderstanding occurs, and by further adding appropriate subscripts as necessary.

The present disclosure is not limited to any one of Embodiment 1 and Embodiment 2 to be described below and may be variously modified or omitted without departing from the technical idea of the present disclosure.

Embodiment 1

FIG. 1 is a diagram for explaining a configuration of an elevator door control system according to Embodiment 1.

As shown in FIG. 1, the elevator door control system according to Embodiment 1 includes a door sensor 1, a door motor control unit 2, a transmission unit 3, a storage unit 4, and a partially broken state determination unit 5. Further, a door panel mechanism 6, a drive motor unit 7, a position detecting unit 8, and an output unit 9 are provided. Note that a link mechanism 10 (not shown) is also provided.

The door sensor 1 detects an obstacle against a door opening/closing operation at an entrance of the elevator. For example, as the door sensor 1 of a contact type for detecting an obstacle through contact, there is a safety shoe, which is widely known. The mechanical pinch detection sensor disclosed in the Patent Document 1 described above is the safety shoe. Further, the door sensor 1 of a non-contact type for detecting an obstacle without contact may be implemented by detecting a light shielding state due to the obstacle using, for example, a light projector and a receiver. Note that, in Embodiment 1, the door sensor 1 may be provided on a car side or a hall side.

The door motor control unit 2 controls the door opening/closing operation on the basis of the detection result of the door sensor 1. The door opening/closing operation here is a door opening/closing operation for implementing a safe operation of the door, for example, by performing control for reversing the opening/closing direction of the door or control for sharply reducing the door speed when an obstacle is detected by the door sensor 1, as described above in relation to the conventional elevator door control system.

The door motor control unit 2 controls a drive current to the drive motor unit 7. The drive motor unit 7 is connected to the door panel mechanism 6. The door motor control unit 2 can implement a desired door opening/closing operation by controlling the drive motor unit 7. Typically, the control for the drive motor unit 7 is achieved by speed feedback control using a speed command value (more precisely, a motor speed command value) for the drive motor unit 7. Specific control for the drive motor unit 7 is often achieved by, for example, calculating an actual motor speed using an output signal obtained from a position detecting unit 8 represented by an encoder connected to the drive motor unit 7, and configuring the speed feedback control such that the calculation result coincides with the speed command value. Note that, in FIG. 1, the speed command value and the configuration of the speed feedback control described here are not shown and are omitted. This is because the main content in the door motor control unit 2 to be described with reference to FIG. 1 is not a function of controlling a desired door opening/closing operation using the output signal obtained from the position detecting unit 8 but a function of controlling the door opening/closing operation on the basis of the detection result of the door sensor 1. Note that the feedback control for achieving each of the former function and the latter function is configured in parallel in the door motor control unit 2. Again, the description of the feedback control for achieving the former function is omitted in FIG. 1.

Note that the door panel mechanism 6 includes a car door, a hall door, and an engaging member. In FIG. 1, neither the car door, the hall door, nor the engaging member is shown. Here, a structure and an operation of the typical door panel mechanism 6 will be briefly described.

A hall door is provided for a hall in each floor level, thereby being plural in all. In contrast, the car door is provided only in the car. The hall door is driven by the drive motor unit 7 provided on the side of the car door. Specifically, the hall door is engaged with the car door by the engaging member, thereby the opening/closing operation is performed integrally with the car door. That is, by transmitting the power by the drive motor unit 7 disposed on the car door side to not only the car door but also the hall door, the car door and the hall door perform the opening/closing operation integrally.

Next, a series of movements of the door from a fully closed state to a fully open state, and further from the fully open state to the fully closed state, will be briefly described. That is, the car arrives at a certain floor with the car door fully closed, and then the drive motor unit 7 starts door opening drive of the car door. Thereafter, the car door and the hall door are engaged with each other to perform the door opening operation integrally, and the door is brought into the fully open state. Then, the drive motor unit 7 starts door closing drive of the car door and continues the door closing operation integrally with the car door and the hall door engaged, thereby bringing the door into the fully closed state. Since the car door and the hall door are no longer engaged when the door is fully closed, the car can start to travel toward the next floor.

The transmission unit 3 between the door sensor 1 and the door motor control unit 2 transmits signals. Then, wiring is performed using a cable as part of or all of the transmission path between the door sensor 1 and the door motor control unit 2. Further, as shown in FIG. 1, the output signal from the transmission unit 3 is input not only to the door motor control unit 2 but also to the storage unit 4 described below. Note that the wiring of the cable is arranged along the link mechanism 10 that performs an extension motion or a bending motion accompanied by the door opening/closing operation, and a plurality of portions thereof are fixed. Specifically, the wiring of the cable is not fixed to the link mechanism 10 in the vicinity of the joint portion (or the joint) of the link mechanism 10 but is fixed to the link mechanism 10 at portions away from the joint portion (or the joint), as already described above in the elevator door control system. Note that, as described above, there are two types of door sensors 1: the contact type and the non-contact type, but in any type of door sensor 1, the wiring of the cable arranged using the link mechanism 10 as described herein is typically performed.

As will be repeated here, in Embodiment 1, the door sensor 1 may be provided on the car side or on the hall side. The link mechanism 10 also may be provided on the side of the car or on the hall side. If both of the door sensor 1 and the link mechanism 10 are installed on the side of the car, the transmission unit 3 can be implemented by providing wiring by the cable as a whole transmission path between the door sensor 1 and the door motor control unit 2, without using radio as a partial transmission path between the door sensor 1 and the door motor control unit 2. In contrast, in the case where the installation places of components for the door sensor 1, the door motor control unit 2, and the link mechanism 10 are separated for the hall side and the car side, the transmission unit 3 is, for example, implemented by wireless line connection as a part of the transmission path between the door sensor 1 and the door motor control unit 2 and performing wiring by the cable for the remaining part.

In the elevator door control system according to Embodiment 1, in order to achieve reliable obstacle detection by making the signal robust against electrical noise, an example of the system configuration is shown in which the output signal from the transmission unit 3 in FIG. 1 is set to High when no obstacle is detected and is set to Low when an obstacle is detected. Therefore, the signal is referred to as a binary signal indicating detection of an obstacle. In other words, it is shown here that the output signal from the transmission unit 3 corresponds to the binary signal indicating the detection of an obstacle.

However, as an example other than this case, there is a case where the output signal from the transmission unit 3, corresponding to the detection signal of the door sensor 1 during the door opening/closing operation, is an analog signal.

In this case, it is necessary to obtain the binary signal indicating the detection of an obstacle by performing signal conversion on the output signal from the transmission unit 3, the output signal being the analog signal.

Therefore, the binary signal indicating the detection of an obstacle is obtained on the basis of the output signal from the transmission unit 3, which corresponds to the detection signal of the door sensor 1 during the door opening/closing operation.

The storage unit 4 stores a change in the binary signal indicating the detection of an obstacle in association with the door position at the time of the change in the binary signal, the change being obtained on the basis of the detection signal from the door sensor 1 during the door opening/closing operation. For example, an output signal obtained from the position detecting unit 8 represented by the encoder is converted into a door position and stored. In addition, it is obvious that a motor angle of the drive motor unit 7 may be stored as data corresponding to the door position instead of the above door position.

The partially broken state determination unit 5 determines whether or not the cable is in a partially broken state on the basis of a timing of the change in the binary signal and the door position at the time of the change in the binary signal. Specifically, the feature thereof is such that whether or not the cable is in the partially broken state is determined on the basis of reproducibility of the door position at the time of the change in the binary signal.

The output unit 9 outputs the determination result of the partially broken state determination unit 5. The output unit 9 is, for example, an LED display, and displays the determination result of the partially broken state determination unit 5. Or the output unit 9 is, for example, a notification unit that reports the determination result of the partially broken state determination unit 5, for example, for calling a maintenance staff.

Figure 2:
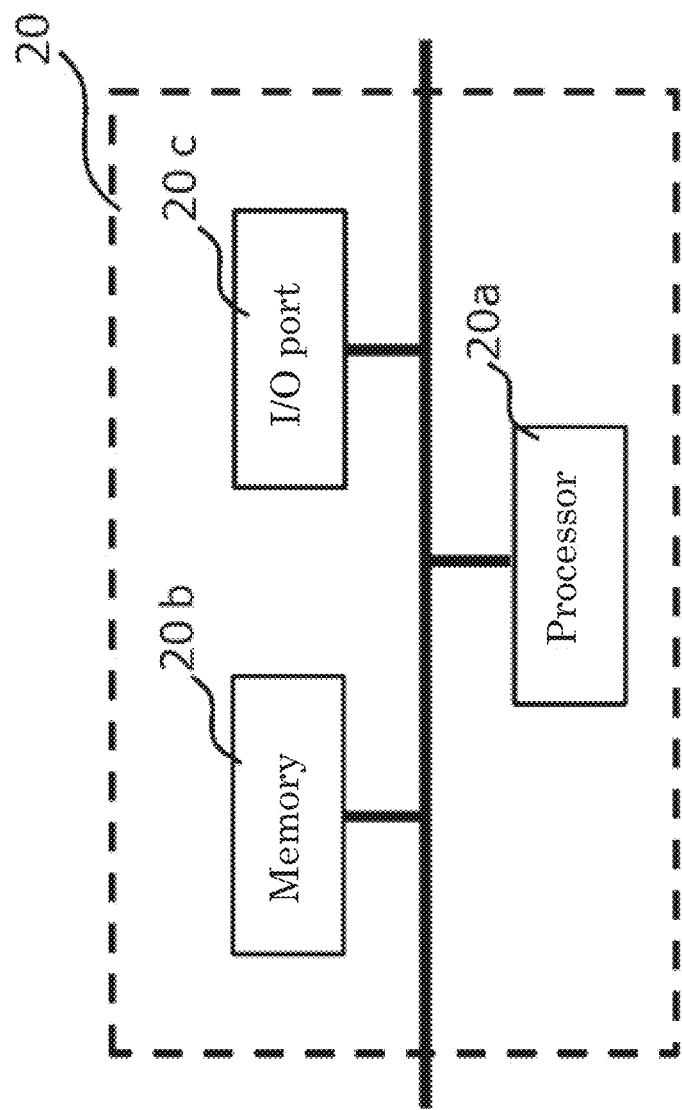
FIG. 2 is an example of a hardware configuration diagram for implementing a door motor control unit, a storage unit, and a partially broken state determination unit in the elevator door control system according to Embodiment 1.

Next, FIG. 2 is used to describe a cooperative operation of software and hardware in the elevator door control system according to Embodiment 1.

FIG. 2 shows an example of a hardware configuration for implementing the door motor control unit 2, the storage unit 4, and the partially broken state determination unit 5 in the elevator door control system according to Embodiment 1.

A function corresponding to each of the door motor control unit 2, the storage unit 4, and the partially broken state determination unit 5 can be implemented by using a processing circuit 20 shown in a hardware configuration diagram of FIG. 2. In FIG. 2, the part surrounded by a broken line is the processing circuit 20.

As shown in FIG. 2, the processing circuit 20 includes at least one processor 20a and at least one memory 20b as the hardware. The processing circuit 20 includes an I/O port 20c capable of inputting and outputting at least a plurality of input and output signals. It has been explained that the output signal from the transmission unit 3 is input not only to the door motor control unit 2 but also to the storage unit 4. According to FIG. 2, for example, the output signal from the transmission unit 3 is input via the I/O port 20c and is input via a data bus to the door motor control unit 2 and the storage unit 4 by software.

When the processing circuit 20 includes at least one processor 20a and at least one memory 20b, the function corresponding to each of the door motor control unit 2, the storage unit 4, and the partially broken state determination unit 5 is implemented by, for example, software, firmware, or a combination of the software and the firmware. At least one of the software and the firmware is written as a program. At least one of the software and the firmware is stored in at least one memory 20b. At least one processor 20a reads out and executes a program stored in at least one memory 20b, thereby implementing the function corresponding to each of the door motor control unit 2, the storage unit 4, and the partially broken state determination unit 5. At least one processor 20a is also referred to as a central processing unit, a processing unit, an arithmetic unit, a microprocessor, a microcomputer, or a DSP. For example, at least one memory 20b may be a non-volatile or volatile semiconductor memory such as a RAM, a ROM, a flash memory, an EPROM, or an EEPROM, and a magnetic disk, a flexible disk, an optical disc, a compact disc, a Mini-Disk, a DVD, or the like.

In this manner, the processing circuit 20 implements the function corresponding to each of the door motor control unit 2, the storage unit 4, and the partially broken state determination unit 5 by the hardware, the software, the firmware, or a combination thereof.

Next, with reference to FIG. 3, a method for determining whether or not the cable is in the partially broken state by the partially broken state determination unit 5 will be described. As described above, the partially broken state determination unit 5 determines whether or not the wiring is in the partially broken state on the basis of the door position and the change in the binary signal indicating the detection of an obstacle. Specifically, the feature thereof is such that whether or not the cable is in the partially broken state is determined on the basis of the reproducibility of the door position at the time of the change in the binary signal. Note that this feature in Embodiment 1 is common to that in Embodiment 2, which will be described later.

First, a method for handling information on the door position and for evaluating the reproducibility of the door position at the time of the change in the binary signal in the partially broken state determination unit 5 will be described.

First, the partially broken state determination unit 5 processes the information on the door position such that a range between a door fully open position and a door fully closed position is divided into a plurality of consecutive sections and the door position during the door opening/closing operation is handled by using a corresponding section in which the door position is included.

As shown in FIG. 1, the information on the door position used in the partially broken state determination unit 5 is, specifically, the information in which the storage unit 4 stores the change in the binary signal indicating the detection of an obstacle in association with the door position, the change being obtained on the basis of the output signal from the door sensor 1 in the door opening/closing operation.

As described above, the function of the storage unit 4 is implemented by the cooperative operation between the software and the hardware using the hardware configuration shown in FIG. 2. Therefore, needless to say, since the hardware resources are limited, efficient use of the hardware resources is the basis for the implementation of the storage unit 4.

If the information on the door position is handled in high precision, a problem arises in that a large amount of hardware resources such as the memory need to be prepared. Therefore, in order to efficiently use the hardware resources, it is important to handle the information on the door position with appropriate accuracy.

By the way, it is assumed that the problem of the wiring in the partially broken state, which is dealt with in the present disclosure, occurs when a bending stress is repeatedly applied to the wiring near the joint portion due to repeated door opening/closing operation, the wiring being not fixed to the link mechanism 10. Therefore, since the door opening/closing operation is repeatedly performed, the state of the wiring is changed from an initial conductive state to the partially broken state where the conduction is eventually poor. Then, when the door opening/closing operation is repeatedly performed, it is believed that the posture of the link mechanism 10 in the partially broken state of the wiring, in other words, the door position in the partially broken state thereof, is substantially the same. Therefore, as a method for determining whether or not the wiring is in the partially broken state, a method using the reproducibility of the door position at the time of the change in the binary signal indicating the detection of an obstacle is proposed.

With the description above, and on the basis of an experiment using an actual elevator, the range between the door fully open position and the door fully closed position is divided into the plurality of consecutive sections, for example, each of the sections having a width of 10 mm at a door position, and the door position during the door opening/closing operation is handled using a corresponding section in which the door position is included. Thus, as beneficial effects, it is not necessary to prepare more hardware resources than necessary, and it is possible to confirm the reproducibility of the door position at the time of the change in the binary signal necessary for determining the partially broken state.

Figure 3:
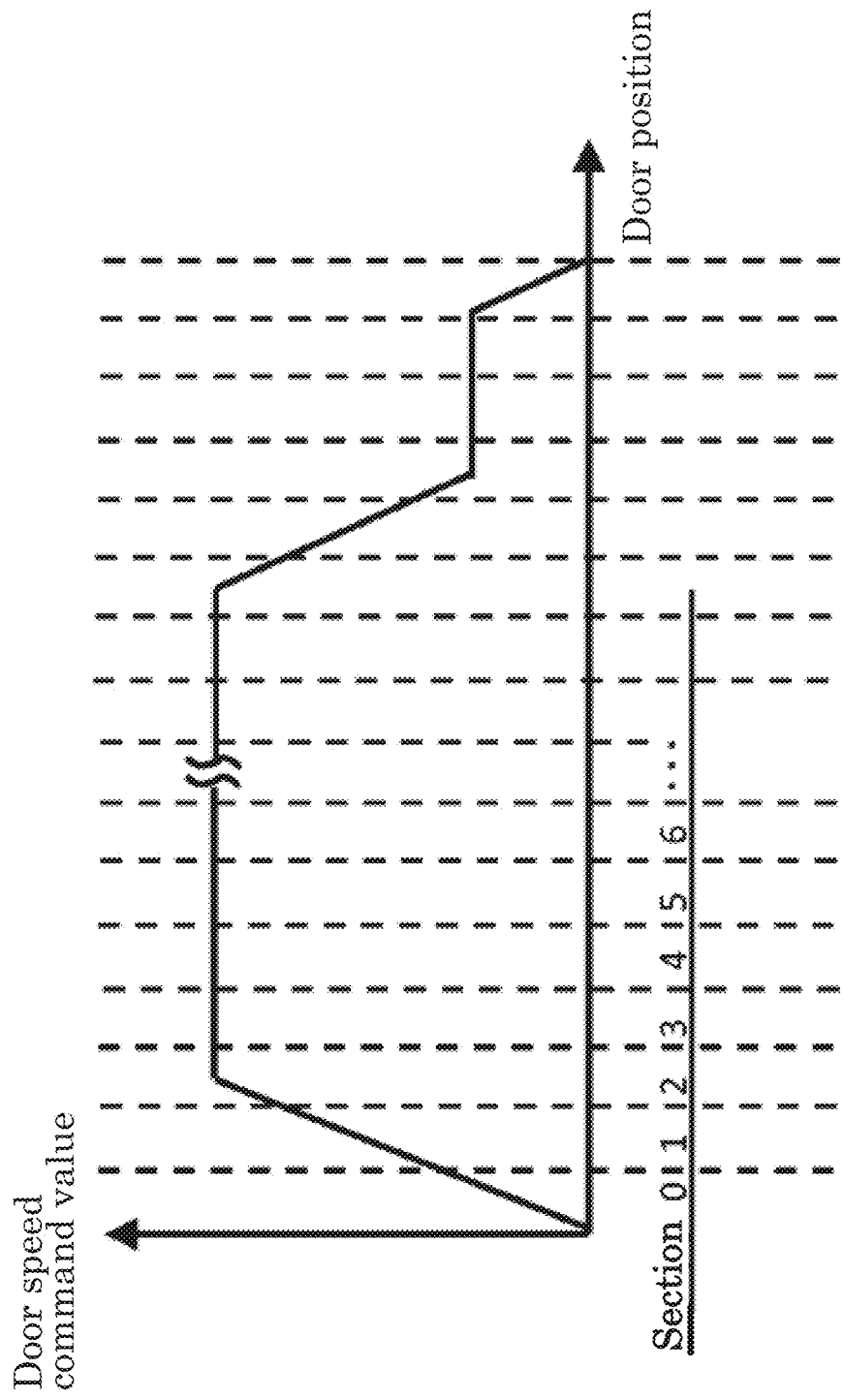
FIG. 3 is a diagram showing sections for managing a door position at a time when a partially broken state is determined and also showing door movement, in the elevator door control system according to Embodiment 1.

For a reference, FIG. 3 shows the door position sections in determining the partially broken stated. FIG. 3 is a diagram showing the movement of the door and the door position sections in determining the partially broken state in the door control system of the elevator according to Embodiment 1. The horizontal axis indicates the door position, and the vertical axis indicates a door speed command value as an example of the movement of the door.

The waveform of the door speed command value shown in FIG. 3 is a waveform in a case where the door opening operation from the fully closed position to the fully open position is performed. FIG. 3 shows an example in which the door position sections are called the zeroth section, the first section, the second section, etc., in order from the fully closed position to the fully open position.

In this manner, the range between the door fully open position and the door fully closed position is divided into the plurality of consecutive sections and the door position during the door opening/closing operation is handled using the corresponding section in which the door position is included, so that it is possible to efficiently use the hardware resources.

Now, a method for evaluating the reproducibility of the door position at the time of the change in the binary signal will be described a little more.

When the electric wire in the cable is in the partially broken state, the conduction becomes poor, and the signal transmitted using the cable becomes unstable. Normally, even in the case where the signal is configured to be set to High when no obstacle is detected and to be set to Low when an obstacle is detected, there is a case where the binary signal indicates High that means no obstacle is detected when an obstacle is detected because the electric wire in the cable is in the partially broken state. That is, when the electric wire in the cable is in the partially broken state, the binary signal may indicate truly Low or High, which occurs not deterministically but stochastically.

Thus, since there is a possibility that the binary signal does not indicate the true Low but indicate High stochastically even when an obstacle is detected, in a case where the binary signal indicates High of the no obstacle detection or Low of the obstacle detection at the same posture of the link mechanism 10 corresponding to the partially broken state, in other words, at the same door position corresponding to the partially broken state when the door is repeatedly opened and closed, it is determined that the obstacle is not correctly detected but the binary signal indicates Low due to electrical noise without detecting the obstacle.

Therefore, reliable determination on the electric wire of the cable in the partially broken state can be implemented using a criterion in which the reproducibility of the door position at the time of the change in the binary signal is confirmed a plurality of times while the door opening/closing operation is repeatedly performed.

Therefore, as described above, the partially broken state determination unit 5 is characterized in that the reproducibility of the door position at the time of the change in the binary signal indicating the detection of an obstacle is used in determining whether or not the electric wire of the cable is in the partially broken state.

Specifically, with the configuration described below, it is possible to reliably determine that the electric wire in the cable are in the partially broken state.

The configuration is as follows. The range between the door fully open position and the door fully closed position is divided into the plurality of consecutive sections, the door position during the door opening/closing operation is handled using the corresponding section where the door position is included, and the partially broken state determination unit 5 includes a counting unit in which counting is performed for each of the corresponding sections including the door position at the time of the change in the binary signal in response to the change in the binary signal indicating the detection of an obstacle, the change in the binary signal being obtained in each of a plurality of the door opening/closing operations on the same floor, and determines that the wiring is in the partially broken state when the count result of the counting unit exceeds a predetermined threshold value.

With this configuration, it is possible to efficiently utilize the hardware resources and to handle the door position information with appropriate accuracy.

In the configuration described above, it is obvious that the same effect can be achieved by using, for example, the motor angle of the drive motor unit 7 as data corresponding to the door position instead of the above door position.

Therefore, the configuration here can be shown again as follows.

That is, an interval between an upper limit and a lower limit in the displacement, which corresponds to the range between the door fully open position and the door fully closed position, is divided into the plurality of consecutive sections, the door position during the door opening/closing operation is handled using the section corresponding to the door position, and the partially broken state determination unit 5 includes a counting unit in which counting is performed for each of the sections corresponding to the door position at the time of the change in the binary signal in response to the change in the binary signal indicating the detection of an obstacle, the change in the binary signal being obtained in each of a plurality of the door opening/closing operations on the same floor, and determines that the wiring is in the partially broken state when the counting result of the counting unit exceeds a predetermined threshold value.

The reproducibility of the door position at the time of the change in the binary signal can be evaluated using a set value of the threshold value.

Further, the threshold value may be set to the same value in all the sections in the range between the door fully open position and the door fully closed position, or may be set for each of the sections, for example.

The threshold value may be changed on the basis of a track record number of times of the door opening/closing using the wiring. The details will be described with reference to FIG. 4.

Figure 4:
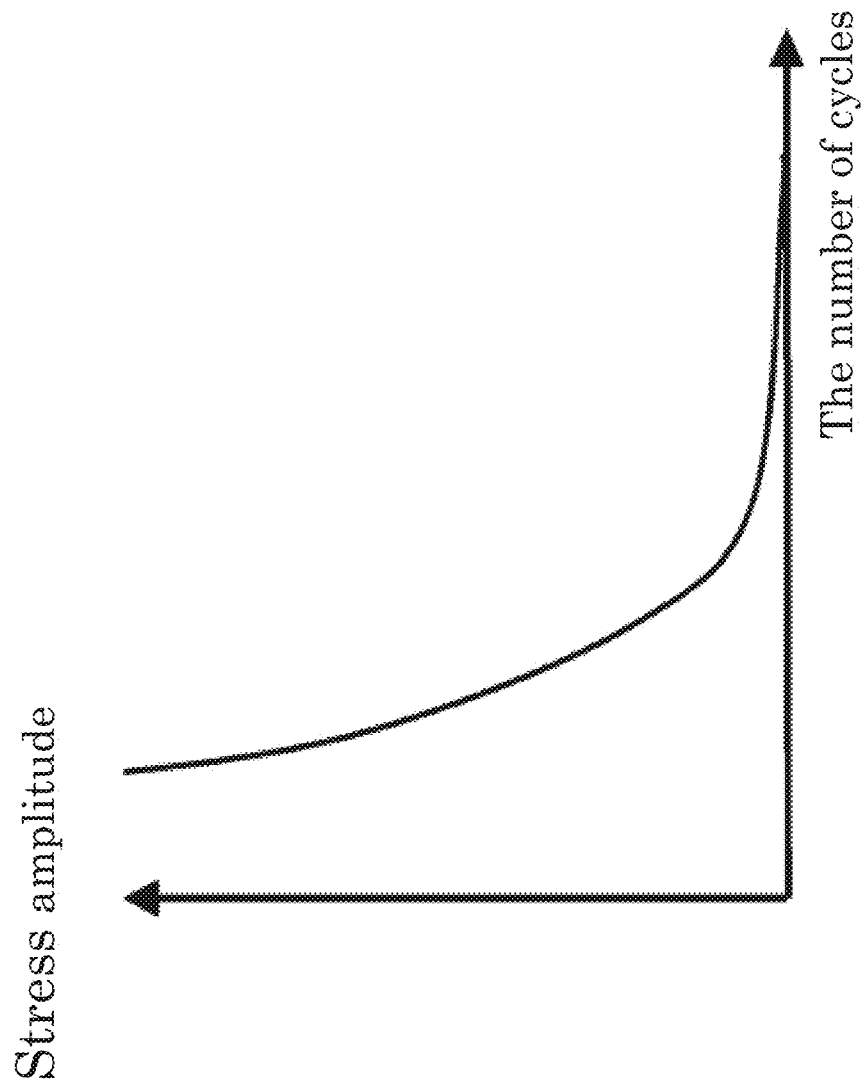
FIG. 4 is a diagram (S-N diagram) for explaining a threshold value used in the partially broken state determination unit in the door control system of the elevator according to Embodiment 1.

FIG. 4 is a diagram (S-N diagram) for explaining the threshold value used by the partially broken state determination unit 5 in the door control system of the elevator according to Embodiment 1.

In general, when metal fatigue is examined, the relationship between a stress amplitude S, which is the difference between the maximum stress and the minimum stress, and the number of cycles N until the object breaks, is evaluated when cyclic stress is applied to the object. In general, this relationship is shown using an S-N diagram in which the vertical axis is the stress amplitude S, which is the difference between the maximum stress and the minimum stress, and the horizontal axis is a logarithm of the number of cycles N. In addition, it is also called a Wohler diagram.

It is known that the Wohler diagram obtained by experiments or the like has a downward-sloping characteristic even in the case where the electric wire is a stranded wire other than a single wire, as in the case where the electric wire is a single wire. For example, Japanese Unexamined Patent Application Publications No. 2014-92512, No. 2002-260459, and No. 2004-191361 may be referred to.

In addition, a paper "Development of Flexural Durability Evaluation Method for Automobile Wire Harness by using Computer Aided Engineering (CAE) Techniques" (Mitsubishi Cable Industries Time, No. 107, October 2010, pp. 21-25) is also useful.

As is clear from FIG. 4, the larger the cyclic stress (more precisely, the stress amplitude 5) applied to the object is, the smaller the number of cycles N until the fracture is. That is, the lifetime until the fracture is shortened, i.e., the shortening of lifetime due to degradation is accelerated. In other words, it is also shown that the smaller the cyclic stress (more precisely, the stress amplitude S) applied to the object, the larger the number of load cycles N until fracture, namely, the longer the lifetime until the fracture.

Therefore, in a state of being wired by a cable, by changing the threshold value to a smaller value as the track record number of times of the door opening/closing increases, an effect can be obtained such that an appropriate threshold value can be set in consideration of the degradation due to the lifetime in accordance with the track record number of times of the door opening/closing. In contrast, even if the threshold value is kept fixed regardless of the number of times of the door opening/closing, it is obvious that a certain effect can be achieved in that a partially broken state, which is one of the degradation phenomena of the electric wire in a cable, can be easily detected.

As described above, the configuration of the elevator door control system according to Embodiment 1 and the basic technical idea thereof have been described.

Figure 5:
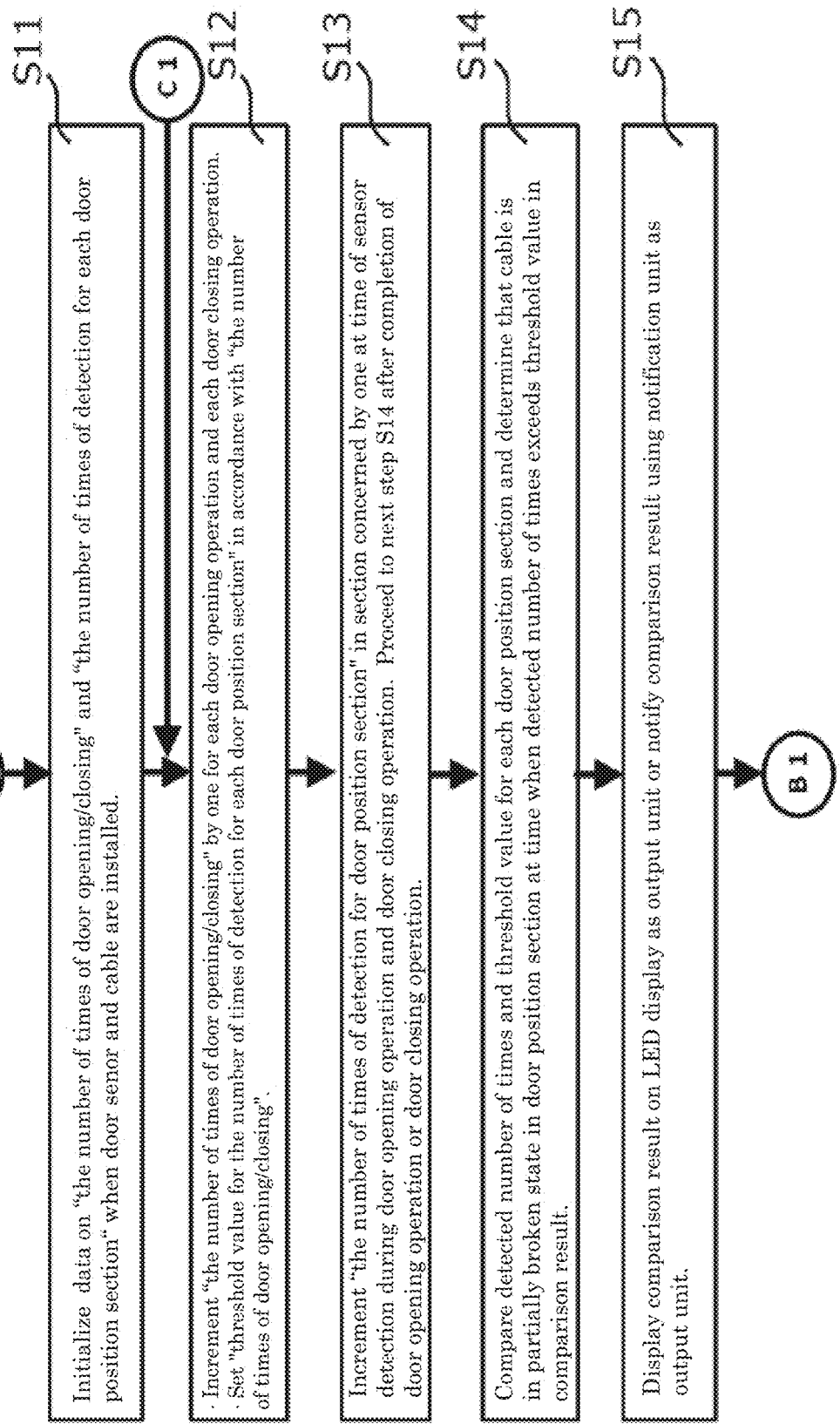
FIG. 5 is a flowchart in relation to a program for implementing the partially broken state determination unit in the door control system of the elevator according to Embodiment 1.

Next, with reference to FIG. 5, a flow for implementing the function of the partially broken state determination unit 5 will be described. FIG. 5 is a flowchart in relation to a program for implementing the partially broken state determination unit 5 in the door control system of the elevator according to Embodiment 1.

Here, it is assumed that the door opening/closing operation, that is, the door opening operation or the door closing operation are repeated on the same floor. Further, it is considered that the door opening or the closing operation is performed in a test mode in a situation where there is no elevator user, for example, at night. Of course, it may also be performed in a normal mode of carrying passengers in a car.

With respect to the program for implementing the partially broken state determination unit 5 in the door control system of the elevator, processing is started from a node A1, which is an initial node.

First, in step S11, data initialization is performed on "the number of times of door opening/closing" and "the number of times of detection for each door position section" in the program for implementing the partially broken state determination unit 5 in the door control system of the elevator when an operator installs the door sensor 1 and the cable.

Next, in step S12, "the number of times of door opening/closing" is incremented by one for each door opening operation and each door closing operation. Further, a "threshold value for the number of times of detection for each door position section" is set in accordance with "the number of times of door opening/closing". As described above, the door motor control unit 2 has a function of controlling a desired door opening/closing operation using the output signal obtained from the position detecting unit 8, and a function of controlling the door opening/closing operation on the basis of the detection result of the door sensor 1. Therefore, in the elevator door control system, it is a premise that a program for implementing the function of controlling a desired door opening/closing operation by using the output signal obtained from the position detecting unit 8 is executed, in addition to the program for implementing the partially broken state determination unit 5 in the elevator door control system described herein. Therefore, the door opening operation and the door closing operation here are under the execution.

Then, in step S13, at the time of sensor detection during the door opening operation and the door closing operation, "the number of times of detection for door position section" in the section concerned is incremented by one. After completion of the door opening operation or the door closing operation, the operation of the next step S14 is performed.

In step S14, the detected number of times and the threshold value are compared for each door position section, and when the detected number of times exceeds the threshold value in the comparison result, it is determined that the cable is in a partially broken state in the door position section at that time.

Next, in step S15, the comparison result is displayed on the LED display as the output unit 9, or the comparison result is notified using the notification unit as the output unit 9. Then, the processing ends at an end node B1.

Note that, after the processing is ended at the end node B1, when the subsequent door opening/closing operation is started by the program for implementing the function for controlling the desired door opening/closing operation using the output signal obtained from the position detecting unit 8, the processing is started at the node C1, and the operation of step S12 is performed.

Figure 6:
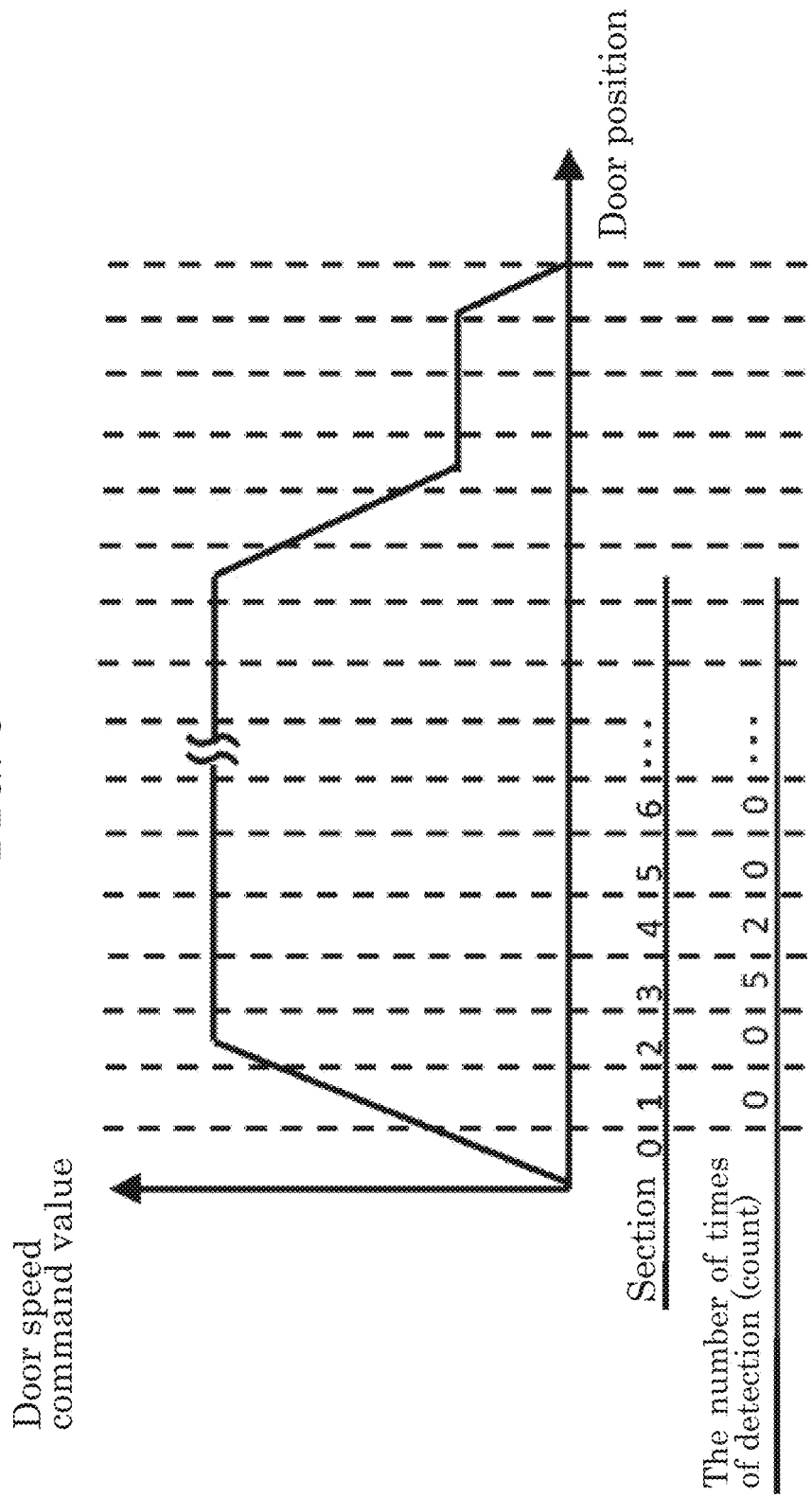
FIG. 6 is a diagram showing the door movement and also showing (an example of) a detection result of the partially broken state caused by repeated door opening/closing operations in the elevator door control system according to Embodiment 1.

When the program shown in the flowchart of FIG. 5 described here is executed, a result shown in FIG. 6 can be obtained. FIG. 6 is a diagram showing a detection result (an example) of the partially broken state caused by repeated door opening/closing operations, together with the movement of the door in the door control system of the elevator according to Embodiment 1. As clearly seen from FIG. 6, "the number of times of detection for each door position section" described in the flow chart of FIG. 5 is added to FIG. 3. By executing the program shown in the flowchart of FIG. 5, the number of times of the detections is counted for each door position section as shown in FIG. 6. At the same time, the number of times of the detection and the threshold value are compared for each door position section, and when the number of times of the detection exceeds the threshold value in the comparison result, it can be determined that the cable is in the partially broken state in the door position section at that time. Further, the output unit 9 outputs the comparison result at this time.

Embodiment 2

An elevator door control system according to Embodiment 2 will be described with reference to FIG. 7 and FIG. 8.

Figure 7:
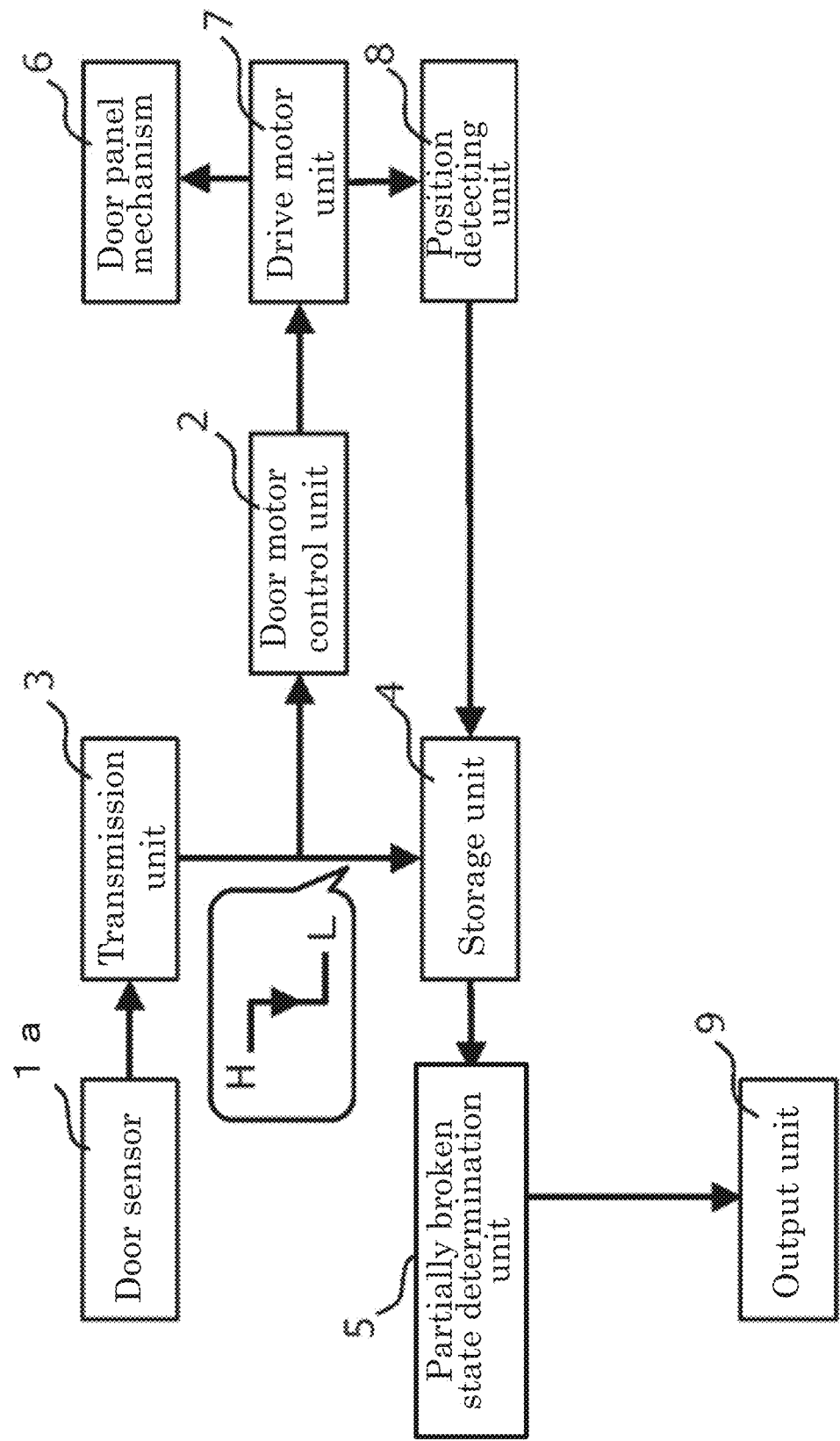
FIG. 7 is a diagram for explaining a configuration of an elevator door control system according to Embodiment 2.

FIG. 7 is a diagram for explaining a configuration of the elevator door control system according to Embodiment 2. In comparison with FIG. 1 for explaining Embodiment 1, it can be seen that the door sensor 1 in FIG. 1 is different from a car side door sensor 1a in FIG. 7. It can be seen that the other components are identical or equivalent components.

Figure 8:
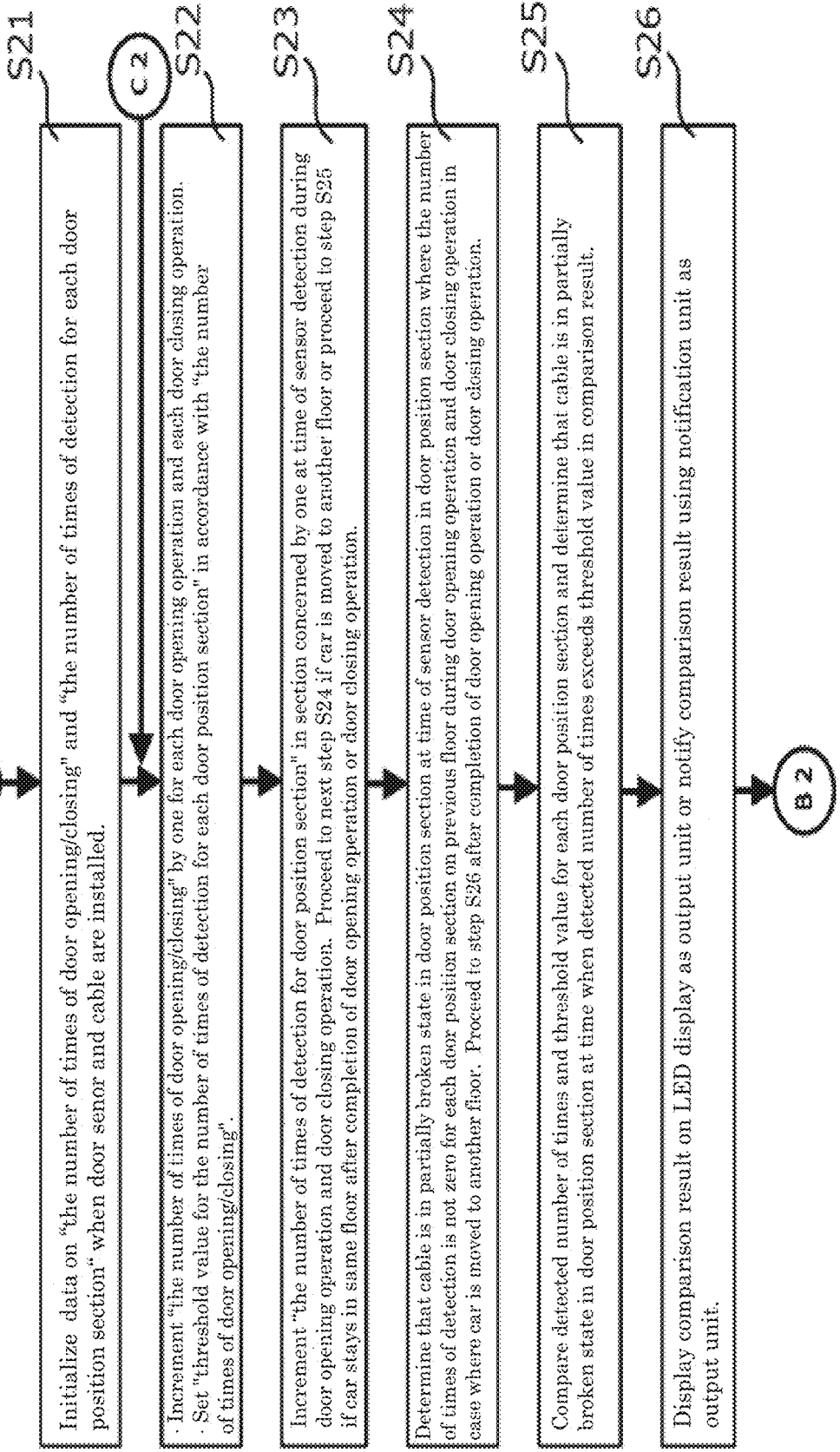
FIG. 8 is a flow chart in relation to a program for implementing a partially broken state determination unit in the elevator door control system according to Embodiment 2.

FIG. 8 is a flowchart regarding a program for implementing the partially broken state determination unit 5 in the door control system of the elevator according to Embodiment 2. As compared with FIG. 5 for explaining Embodiment 1, it can be seen that the flowchart shown in FIG. 7 is largely different from that shown in FIG. 5 in that step S24 is added. It can be seen that the other steps are generally similar in the contents.

Therefore, in the description of Embodiment 2 with reference to FIG. 7 and FIG. 8, points that are clearly different or greatly different from those described before in Embodiment 1 with reference to FIG. 1 and FIG. 5 will be focused on.

Note that, for understanding the essence by first explaining the operation rather than explaining the configuration in the embodiment, the operation will first be simply explained without using FIG. 8.

As described with reference to FIG. 5, the case in Embodiment 1 is assumed that the door opening/closing operation, that is, the door opening operation and the door closing operation, is repeated on the same floor. In contrast, in Embodiment 2, it is assumed that after the door opening/closing operation on the same floor, the door opening/closing operation is performed after the car has moved to another floor by traveling in a hoistway.

The feature of the elevator door control system according to Embodiment 2 is as follows.

In addition to the feature common to Embodiment 1, Embodiment 2 is further characterized in that the door sensor 1 and the link mechanism 10 are provided on the car side, the storage unit 4 stores, as a first door position, a door position at a time when the binary signal changes during the door opening/closing operation on a first floor, and stores, as a second door position, a door position at a time when the binary signal changes during the door opening/closing operation on a second floor, and a partially broken state determination unit 5 determines that the electric wire of the cable is in the partially broken state when the first door position and the second door position coincide with each other.

The feature common to Embodiment 1 is that the partially broken state determination unit 5 determines whether or not the cable is in the partially broken state on the basis of the reproducibility of the door position at the time of the change in the binary signal indicating the detection of an obstacle, the change being obtained on the basis of the detection signal of the door sensor 1 during the door opening/closing operation.

Thus, in Embodiment 2, since the door sensor 1 and the link mechanism 10 are provided on the car side, as a result, the wiring of the cable is also provided on the car side. Therefore, in Embodiment 2, when whether or not the cable is in the partially broken state is determined on the basis of the reproducibility of the door position at the change in the binary signal indicating the detection of an obstacle as a common feature here in the disclosure, the change being obtained on the basis of the detection signal of the door sensor 1 during the door opening/closing operation, an inherent feature of Embodiment 2 is that the reproducibility of the door position is evaluated by using the first door position and the second door position.

If the door sensor 1 and the link mechanism 10 are provided on the door on the hall side, the door sensor 1 and the link mechanism 10 are provided on each of the hall sides on the first floor and the second floor, and the cable for which a partially broken state is to be determined exists for each hall, and thus even if the first door position and the second door position are compared, it can be understood that reproducibility of the door position for determination of the cable wire in the partially broken state cannot necessarily be evaluated. As described with reference to FIG. 4, as the track record number of times of the door opening/closing increases in the state of being wired by the cable, partial disconnection, which is one of the deterioration phenomena due to the lifetime, tends to occur more easily. At the same time, it is apparent that the number of times of the door opening/closing on each of the hall sides on the first floor and the second floor is typically different.

Accordingly, it is appropriate to assume that the cable existing on each of the hall sides on the first floor and the second floor is in a different state of deterioration, and as a result, it is understood that the reproducibility of the door position for determining that the wire of the cable is in the partially broken state cannot be evaluated.

As described above, FIG. 7 showing the configuration of Embodiment 2 differs from FIG. 1 showing the configuration of Embodiment 1 in that, instead of the door sensor 1 shown in FIG. 1, the car side door sensor 1 serving as the door sensor 1 is provided on the car side.

The handling of the door position information in Embodiment 2 is the same as that described in Embodiment 1. That is, also in the partially broken state determination unit 5 according to Embodiment 2, the range between the door fully open position and the door fully closed position is divided into the plurality of consecutive sections, and a door position during the door opening/closing operation is handled by using the corresponding section where the door position is included.

It is obvious that the motor angle of the drive motor unit 7, for example, may be used as data corresponding to the door position instead of the door position described here.

Therefore, also in the partially broken state determination unit 5 according to Embodiment 2, the interval between the upper limit and the lower limit in the displacement, which corresponds to the range between the door fully open position and the door fully closed position, is divided into the plurality of consecutive sections, and the door position during the door opening/closing operation is handled by using the section corresponding to the door position.

Next, with reference to FIG. 8, a flow for implementing the function of the partially broken state determination unit 5 will be described. FIG. 8 is a flowchart in relation to a program for implementing the partially broken state determination unit 5 in the door control system of the elevator according to Embodiment 2.

Here, as will be repeated, it is assumed that after the door opening/closing operation on the same floor, the door opening/closing operation is performed after the car has moved to another floor by traveling in the hoistway.

Further, it is considered that the door opening/closing operation is performed as a test mode in a situation where there is no elevator user, for example, at night. Of course, it may also be performed as a normal mode of carrying passengers in the car.

With respect to the program for implementing the partially broken state determination unit 5 in the door control system of the elevator, the processing is started from a node A2, which is an initial node.

First, in step S21, data initialization is performed on "the number of times of door opening/closing" and "the number of times of detection for each door position section" in the program for implementing the partially broken state determination unit 5 in the door control system of the elevator when an operator installs the door sensor 1 and the cable.

Next, in step S22, "the number of times of door opening/closing" is incremented by one for each door opening operation and each door closing operation. Further, the "threshold value for the number of times of detection for each door position section" is set in accordance with the "number of times of door opening/closing". As described above, the door motor control unit 2 has the function of controlling a desired door opening/closing operation using the output signal obtained from the position detecting unit 8, and the function of controlling the door opening/closing operation on the basis of the detection result of the door sensor 1. Therefore, in the elevator door control system, a program for implementing the function of controlling a desired door opening/closing operation by using the output signal obtained from the position detecting unit 8 is executed, in addition to the program for implementing the partially broken state determination unit 5 in the elevator door control system described herein. Therefore, the door opening operation and the door closing operation here are under the execution.

Then, in step S23, at the time of sensor detection during the door opening operation and the door closing operation, "the number of times of detection for door position section" in the section concerned is incremented by one. After completion of the door opening operation or the door closing operation, an operation of next step S24 is performed if the car is moved to another floor. If the car stays on the same floor, an operation of step S25 is performed.

In step S24, during the door opening operation and the door closing operation in a case where the car is moved to another floor, at the time of sensor detection in a door position section where the number of times of detection is not zero for each door position section on the previous floor, it is determined that the cable is in the partially broken state in the door position section at that time. After completion of the door opening operation or the door closing operation, an operation of step S26 is performed.

In step S25, the detected number of times and the threshold value are compared for each door position section, and when the detected number of times exceeds the threshold value in the comparison result, it is determined that the cable is in the partially broken state in the door position section at that time.

Next, in step S26, the comparison result is displayed on the LED display as the output unit 9, or the comparison result is notified using the notification unit as the output unit 9. Then, the processing ends at an end node B2.

Note that, after the processing is ended at the end node B2, when the subsequent door opening operation or door closing operation is started by the program for implementing the function for controlling the desired door opening/closing operation using the output signal obtained from the position detecting unit 8, the processing is started at a node C2, and the operation of step S22 is performed.

As described above, in the elevator door control system according to Embodiment 2, in particular, the door sensor and the link mechanism are provided on the car side, and the storage unit stores, as the first door position, the door position at the time when the binary signal changes during the door opening/closing operation on the first floor, and also stores, as the second door position, the door position at the time when the binary signal changes during the opening/closing operation of the door on the second floor, and the partially broken state determination unit determines that the cable is in the partially broken state when the first door position and the second door position coincide with each other.

According to this configuration, an effect can be obtained in that, after the door opening/closing operation on the same floor, in the case where the door opening/closing operation is performed after the car is moved to another floor by traveling in the hoistway, the partially broken state of the electric wire in the cable due to repeated bending deformation of the cable of the door sensor can be easily detected.

DESCRIPTION OF REFERENCE NUMERALS AND SIGNS

1: door sensor, 1*a*: car door sensor, 2: door motor control unit, 3: transmission unit, 4: storage unit, 5: partially broken state determination unit, 6: door panel mechanism, 7: drive motor unit, 8: position detecting unit, 9: output unit, 10: link mechanism 10, 20: processing circuit, 20*a*: processor, 20*b*: memory, 20*c*: I/O port.

The invention claimed is:

1. An elevator door control system comprising:
    a door sensor to detect an obstacle against a door opening/closing operation at an entrance of an elevator;
    door motor controlling circuitry to control the door opening/closing operation based on a detection result of the door sensor;
    a transmitter to transmit a signal between the door sensor and the door motor controlling circuitry, the transmitter being wired by a cable as part of or all of a transmission path between the door sensor and the door motor controlling circuitry;
    a storage to store a change in a binary signal indicating detection of an obstacle in association with a door position at a time of the change in the binary signal, the change being obtained based on a detection signal of the door sensor during the door opening/closing operation; and
    partially broken state determination circuitry to determine whether or not the cable is in a partially broken state based on a timing of the change in the binary signal and a door position at the time of the change in the binary signal, wherein
    the cable is arranged along a link mechanism that performs an extension motion and a bending motion accompanied by the door opening/closing operation, and is fixed to the link mechanism at a plurality of portions, and
    the partially broken state determination circuitry determines whether or not the cable is in the partially broken state based on reproducibility of the door position at the time of the change in the binary signal.

2. The elevator door control system according to claim 1, wherein
    an interval between an upper limit and a lower limit of displacement corresponding to a range between a door fully open position and a door fully closed position is divided into a plurality of consecutive sections, and a door position during the door opening/closing operation is handled using the section corresponding to the door position concerned, and,
    the partially broken state determination circuitry includes counting circuitry in which counting is performed for each of the sections corresponding to a door position at the time of the change in the binary signal in response to the change in the binary signal indicating the detection of an obstacle, the change being obtained during a plurality of door opening/closing operations on the same floor, and determines that the cable is in the partially broken state when a counting result of the counting circuitry exceeds a predetermined threshold value.

3. The elevator door control system according to claim 2, wherein the threshold value is changed based on a track record number of times of door opening/closing in a state of being wired by the cable.

4. The elevator door control system according to claim 3, wherein the threshold value is changed to a smaller value as the track record number of times of door opening/closing in a state of being wired by the cable increases.

5. The elevator door control system according to claim 4, wherein the threshold value is set for each of the sections.

6. The elevator door control system according to claim 2, wherein the threshold value is set for each of the sections.

7. The elevator door control system according to claim 3, wherein the threshold value is set for each of the sections.

8. The elevator door control system according to claim 1, wherein the door sensor and the link mechanism are provided on a car side, the storage stores, as a first door position, a door position at the time of the change in the binary signal during the door opening/closing operation on a first floor and also stores, as a second door position, a door position at the time of the change in the binary signal during the door opening/closing operation on a second floor, and the partially broken state determination circuitry determines that the cable is in the partially broken state when the first door position and the second door position coincide with each other.

9. The elevator door control system according to claim 8, wherein an interval between an upper limit and a lower limit of displacement corresponding to a range between a door fully open position and a door fully closed position is divided into a plurality of consecutive sections, and a door position during the door opening/closing operation is handled using the section corresponding to the door position concerned.

* * * * *